(12) United States Patent
Lan et al.

(10) Patent No.: US 8,957,452 B2
(45) Date of Patent: Feb. 17, 2015

(54) LIGHT EMITTING DIODE STRUCTURE

(71) Applicant: Lextar Electronics Corporation, Hsinchu (TW)

(72) Inventors: Cheng-Chun Lan, New Taipei (TW); Tzu-Hung Chou, Zhongli (TW); Chi-Chung Chao, Taichung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/189,136

(22) Filed: Feb. 25, 2014

(65) Prior Publication Data

US 2014/0374767 A1    Dec. 25, 2014

(30) Foreign Application Priority Data

Jun. 21, 2013 (TW) .............................. 102122193 A

(51) Int. Cl.
*H01L 33/00* (2010.01)
*H01L 27/15* (2006.01)

(52) U.S. Cl.
CPC ..................................... *H01L 27/15* (2013.01)
USPC ........................................................... 257/99

(58) Field of Classification Search
USPC ........................................................... 257/99
See application file for complete search history.

(56) References Cited

FOREIGN PATENT DOCUMENTS

TW              492202 B       6/2002

*Primary Examiner* — Marvin Payen
(74) *Attorney, Agent, or Firm* — Moser Taboada

(57) ABSTRACT

A light emitting diode (LED) structure includes a substrate, an LED element, a reverse current protection element, a third conductor, and a fourth conductor. The LED element includes a first N-type semiconductor layer, a first lighting layer, a first P-type semiconductor layer, a first transparent conductive layer, a first electrode, and a second electrode. The reverse current protection element is located on the substrate and surrounds the LED element. The reverse current protection element includes a stack layer, a first conductor, and a second conductor. The stack layer is formed on the substrate by sequentially stacking a second N-type semiconductor layer, a second lighting layer, and a second P-type semiconductor layer. The third conductor is electrically connected to the first conductor and the second electrode. The fourth conductor is electrically connected to the second conductor and the first electrode.

17 Claims, 5 Drawing Sheets

LIGHT EMITTING DIODE STRUCTURE

RELATED APPLICATIONS

This application claims priority to Taiwan Application Serial Number 102122193, filed Jun. 21, 2013, which is herein incorporated by reference.

BACKGROUND

1. Field of Invention

The present invention relates to a light emitting diode structure.

2. Description of Related Art

FIG. 1 is a cross-sectional view of a conventional light emitting diode structure 200. As shown in FIG. 1, the light emitting diode structure 200 includes a substrate 210, and an N-type semiconductor layer 220, a light emitting layer 230, a P-type semiconductor layer 240, a transparent conductor layer 250, a positive electrode 260 and a negative electrode 270 are stacked on the substrate 210. Part of the N-type semiconductor layer 220 that is not covered by the light emitting layer 230, the P-type semiconductor layer 240, and the transparent conductor layer 250 may be formed by photolithography and etching processes. When the positive electrode 260 and the negative electrode 270 are electrically connected to external electrical power, electrical current will pass from the P-type semiconductor layer 240 to the N-type semiconductor layer 220 by way of the light emitting layer 230, such that the light emitting layer 230 is excited to emit light.

However, when the light emitting diode structure 200 is subjected to electrostatic discharge, reverse current may be generated and pass from the N-type semiconductor layer 220 to the P-type semiconductor layer 240 through the light emitting layer 230, causing damage to the light emitting diode structure 200. In the prior art, to solve the problem of damage to the light emitting diode structure 200 by electrostatic discharge, the light emitting diode structure 200 may be connected to an additional physical Zener diode to deal with reverse breakdown voltage. Thus, manufacturing costs are increased.

Moreover, a Zener diode takes up a module space for receiving the light emitting diode structure 200 and cannot enhance the light emitting efficiency of the light emitting diode structure 200.

SUMMARY

An aspect of the present invention is to provide a light emitting diode structure.

According to one embodiment of the present invention, a light emitting diode structure includes a substrate, an LED element, a reverse current protection element, a third conductor, and a fourth conductor. The LED element includes a first N-type semiconductor layer, a first lighting layer, a first P-type semiconductor layer, a first transparent conductive layer, a first electrode, and a second electrode. The first N-type semiconductor layer is located on the substrate. The first lighting layer is located on part of the first N-type semiconductor layer, and a remaining part of the first N-type semiconductor layer is exposed from the first lighting layer. The first P-type semiconductor layer is located on the first lighting layer, and the first transparent conductive layer covers the first P-type semiconductor layer. The first electrode is located on the first transparent conductive layer, and the second electrode is located on an uncovered part of the first N-type semiconductor layer. The reverse current protection element is located on the substrate and surrounds the LED element. An insulation gap is defined between the LED element and the reverse current protection element. The reverse current protection element includes a stack layer, a first conductor, and a second conductor. The stack layer is formed on the substrate by sequentially stacking a second N-type semiconductor layer, a second lighting layer, and a second P-type semiconductor layer. Part of the second N-type semiconductor layer adjacent to the first electrode is exposed and not covered by the second lighting layer and the second P-type semiconductor layer. The first conductor is located on the second P-type semiconductor layer adjacent to the second electrode, and the second conductor is located on an exposed part of the second N-type semiconductor layer. The third conductor is electrically connected to the first conductor and the second electrode, and the fourth conductor is electrically connected to the second conductor and the first electrode, such that the LED element is reversely connected to the reverse current protection element in parallel.

In one embodiment of the present invention, the first electrode and the second electrode are located on opposite sides of the LED element.

In one embodiment of the present invention, the first conductor and the second conductor are located on opposite sides of the reverse current protection element.

In one embodiment of the present invention, the reverse current protection element further includes a second transparent conductive layer that is located on the second P-type semiconductor layer.

In one embodiment of the present invention, the light emitting diode structure further includes a first insulation layer. The first insulation layer covers the sidewall of the LED element that faces the second conductor.

In one embodiment of the present invention, the light emitting diode structure further includes a second insulation layer. The second insulation layer covers the sidewall of the reverse current protection element that faces the first electrode.

In one embodiment of the present invention, a first insulation gap is defined between the first insulation layer and the second insulation layer.

In one embodiment of the present invention, the light emitting diode structure further includes a third insulation layer. The third insulation layer covers the sidewall of the LED element that faces the first conductor.

In one embodiment of the present invention, the light emitting diode structure further includes a fourth insulation layer. The fourth insulation layer covers the sidewall of the reverse current protection element that faces the second electrode.

In one embodiment of the present invention, a second insulation gap is defined between the third insulation layer and the fourth insulation layer.

In one embodiment of the present invention, the cross-sectional area of the LED element in a direction parallel to the substrate is larger than the projection area of the reverse current protection element on the substrate.

In one embodiment of the present invention, the first and second P-type semiconductor layers and the first and second N-type semiconductor layers are made of a material that includes nitride.

In one embodiment of the present invention, the first and second P-type semiconductor layers and the first and second N-type semiconductor layers are made of a material that includes gallium nitride.

In one embodiment of the present invention, the reverse current protection element is a Zener diode.

In one embodiment of the present invention, the substrate is a Sapphire substrate.

In one embodiment of the present invention, the first, second, third, and fourth insulation layers are made of a material that is selected from the group consisting of including silicon dioxide ($SiO_2$), silicon nitride (SiN), and combinations thereof.

In the aforementioned embodiments of the present invention, the reverse current protection element includes the stack layer, and the first and second conductors, and the stack layer is formed on the substrate by sequentially stacking the second N-type semiconductor layer, the second lighting layer, and the second P-type semiconductor layer. Thus, the reverse current protection element and the LED element can be manufactured at the same time, such as through physical vapor deposition (PVD), photolithography and etching processes. As a result, the light emitting diode structure includes an equivalent circuit that models a Zener diode so that the light emitting diode structure can be protected against electrostatic discharge (ESD) without the use of an additional physical Zener diode. Manufacturing costs for the light emitting diode structure are significantly reduced, and the reverse current protection element of the light emitting diode structure does not take up a module space for receiving the light emitting diode structure.

Furthermore, the insulation gap is defined between the reverse current protection element and the LED element so that the path of light extraction is increased. Thus, the light emitting efficiency and the brightness of the light emitting diode structure can be improved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
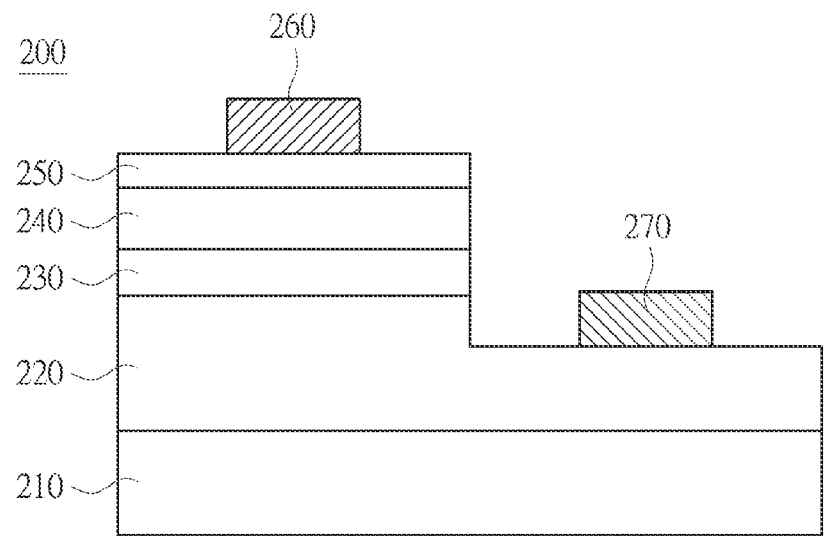
FIG. 1 is a cross-sectional view of a conventional light emitting diode structure.

Reference will now be made in detail to the present embodiments of the invention, examples of which are illustrated in the accompanying drawings. Wherever possible, the same reference numbers are used in the drawings and the description to refer to the same or like parts.

Figure 2A:
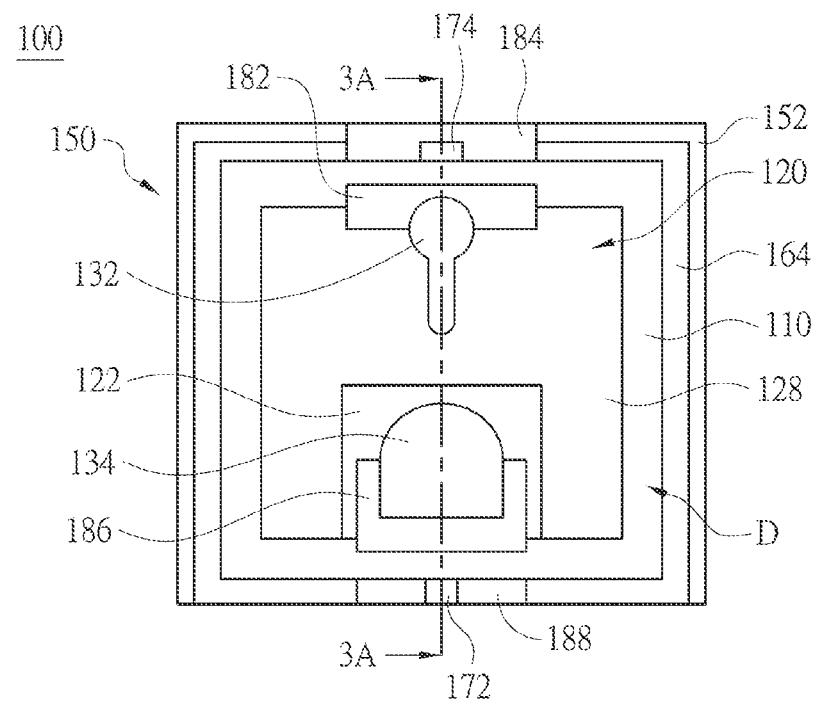
FIG. 2A is a top view of a light emitting diode structure according to one embodiment of this invention.
Figure 2B:
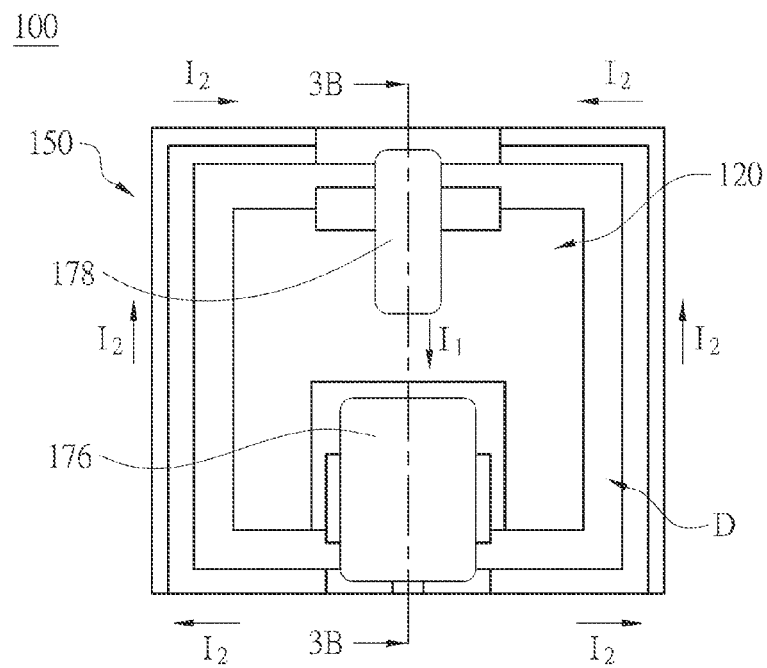
FIG. 2B is a top view of the light emitting diode structure of FIG. 2A according to one embodiment of this invention, in which the light emitting diode structure includes a third conductor and a fourth conductor.

FIG. 2A is a top view of a light emitting diode structure 100 according to one embodiment of this invention. FIG. 2B is a top view of the light emitting diode structure 100 of FIG. 2A according to one embodiment of this invention, in which the light emitting diode structure 100 includes a third conductor 176 and a fourth conductor 178. Referring to FIGS. 2A and 2B, the light emitting diode structure 100 includes a substrate 110, an LED element 120, a reverse current protection element 150, the third conductor 176, and the fourth conductor 178. The reverse current protection element 150 is located on the substrate 110 and surrounds the LED element 120. Moreover, an insulation gap D is defined between the reverse current protection element 150 and the LED element 120. The description in the following will explain the structures of the LED element 120 and the reverse current protection element 150.

Figure 3A:
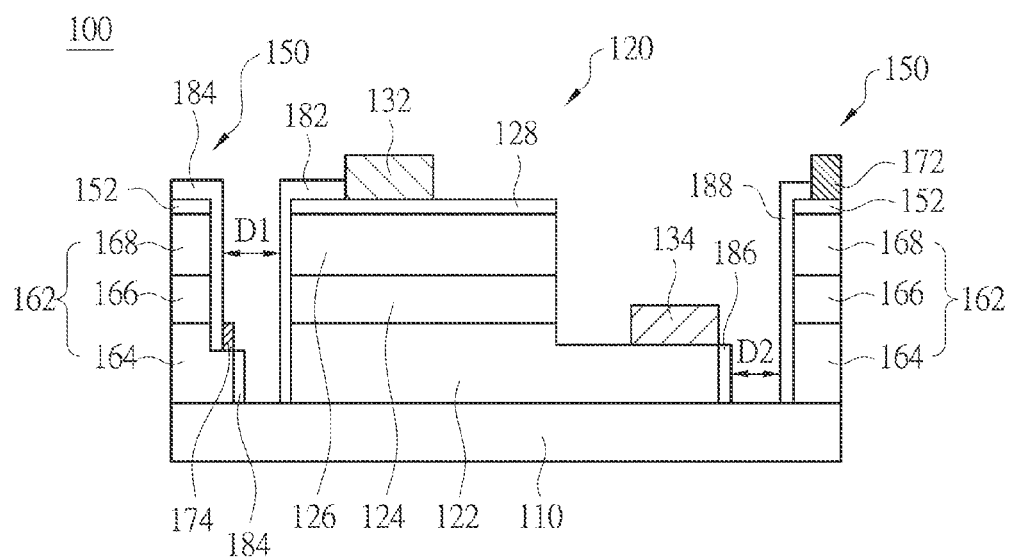
FIG. 3A is a cross-sectional view taken along line 3A-3A of FIG. 2A, illustrating the light emitting diode structure.

FIG. 3A is a cross-sectional view taken along line 3A-3A of FIG. 2A, illustrating the light emitting diode structure 100. Referring to FIGS. 2A and 3A, the cross-sectional area of the LED element 120 in a direction parallel to the substrate 110 is larger than a projection area of the reverse current protection element 150 on the substrate 110. The LED element 120 includes a first N-type semiconductor layer 122, a first lighting layer 124, a first P-type semiconductor layer 126, a first transparent conductive layer 128, a first electrode 132, and a second electrode 134. The first N-type semiconductor layer 122 is located on the substrate 110. The first lighting layer 124 is located on part of the first N-type semiconductor layer 122, and a remaining part of the first N-type semiconductor layer 122 is exposed from the first lighting layer 124. The first P-type semiconductor layer 126 is located on the first lighting layer 124, and the first P-type semiconductor layer 126 is covered by the first transparent conductive layer 128. The first electrode 132 is located on the first transparent conductive layer 128, and the second electrode 134 is located on an uncovered part of the first N-type semiconductor layer 122. Furthermore, the first and second electrodes 132, 134 are located on opposite sides of the LED element 120, as shown in FIG. 2A.

The reverse current protection element 150 includes a stack layer 162, a first conductor 172, and a second conductor 174. The stack layer 162 is formed on the substrate 110 by sequentially stacking a second N-type semiconductor layer 164, a second lighting layer 166, and a second P-type semiconductor layer 168. Part of the second N-type semiconductor layer 164 adjacent to the first electrode 132 is exposed and not covered by the second lighting layer 166 and the second P-type semiconductor layer 168. The first conductor 172 is located on the second P-type semiconductor layer 168 adjacent to the second electrode 134, and the second conductor 174 is located on an uncovered part of the second N-type semiconductor layer 164. Moreover, the first and second conductors 172, 174 are located on opposite sides of the reverse current protection element 150, as shown in FIG. 2A.

In this embodiment, the reverse current protection element 150 may further include a second transparent conductive layer 152 formed on the second P-type semiconductor layer 168, and the second transparent conductive layer 152 is located between the first conductor 172 and the second P-type semiconductor layer 168.

Furthermore, the light emitting diode structure 100 may further include a first insulation layer 182, a second insulation layer 184, a third insulation layer 186, and a fourth insulation layer 188. The first insulation layer 182 covers the sidewall of the LED element 120 that faces the second conductor 174, and the second insulation layer 184 covers the sidewall of the reverse current protection element 150 that faces the first electrode 132, such that a first insulation gap D1 is defined between the first and second insulation layers 182, 184. The third insulation layer 186 covers the sidewall of the LED element 120 that faces the first conductor 172, and the fourth insulation layer 188 covers the sidewall of the reverse current protection element 150 that faces the second electrode 134, such that a second insulation gap D2 is defined between the third and fourth insulation layers 186, 188.

In this embodiment, the substrate 110 may be a Sapphire substrate. The first P-type semiconductor layer 126, the second P-type semiconductor layer 168, the first N-type semiconductor layer 122, and the second N-type semiconductor layer 164 are made of a material that includes nitride such as gallium nitride (GaN). The first insulation layer 182, the second insulation layer 184, the third insulation layer 186, and the fourth insulation layers 188 may be made of silicon dioxide ($SiO_2$), silicon nitride (SiN), or combinations thereof. However, the present invention is not limited in this regard.

Figure 3B:
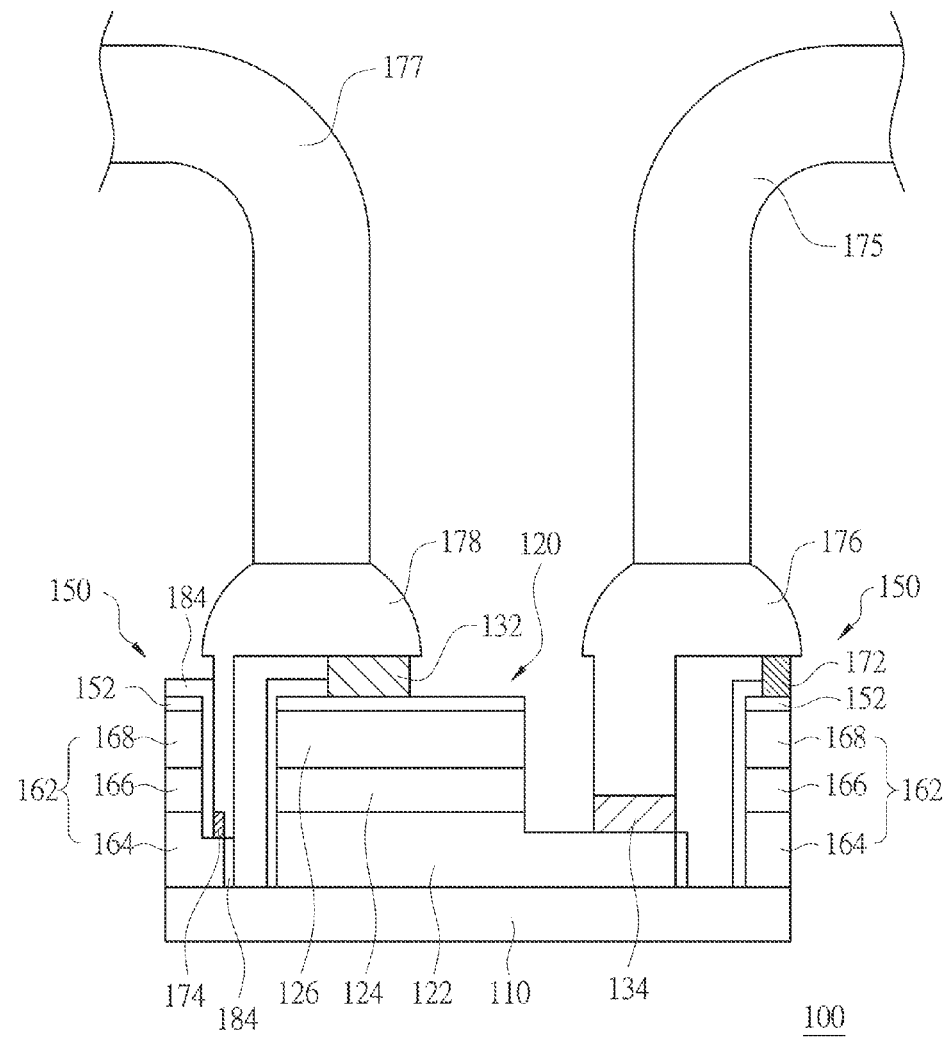
FIG. 3B is a cross-sectional view taken along line 3B-3B of FIG. 2B, in which the third conductor and the fourth conductor are connected to conductive wires.

FIG. 3B is a cross-sectional view taken along line 3B-3B of FIG. 2B, illustrating the third conductor 176 and the fourth conductor 178 respectively connected to conductive wires 175 and 177. Referring to FIGS. 2B and 3B, the third conductor 176 is electrically connected to the first conductor 172 and the second electrode 134. The fourth conductor 178 is electrically connected to the second conductor 174 and the first electrode 132. The conductive wires 175 and 177 may be gold wires, and respectively fixed to the third conductor 176 and the fourth conductor 178 by a soldering process. When the conductive wires 175 and 177 are connected to external electrical power, the LED element 120 may generate electrical currents.

It is to be noted that the connection relationships and materials of the elements described above will not be repeated in the following descriptions. The following descriptions will explain the direction of current when the light emitting diode structure 100 emits light, and explain the direction of reverse current when the light emitting diode structure 100 is subjected to electrostatic discharge.

Figure 4:
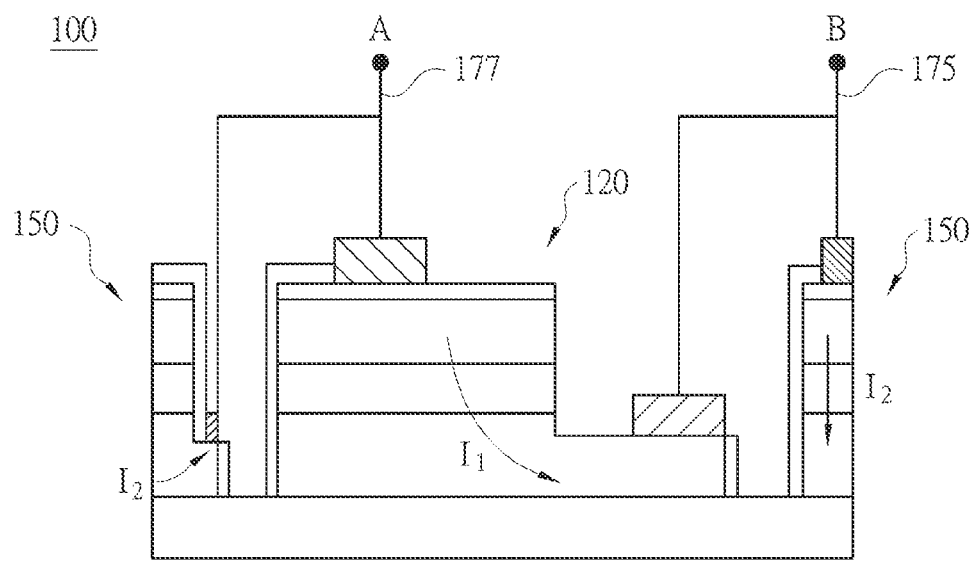
FIG. 4 is a schematic view of the directions of currents when an LED element and a reverse current protection element of FIG. 3B are operated.

FIG. 4 is a schematic view of the directions of currents $I_1$ and $I_2$ when the LED element 120 and the reverse current protection element 150 of FIG. 3B are operated. Referring to FIGS. 3B and 4, point A may be the positive electrode of power, and point B may be the negative electrode of power. When the first electrode 132 and the second electrode 134 of the LED element 120 are connected to electrical power, electric current $I_1$ flows in the direction from the first P-type semiconductor layer 126 to the first N-type semiconductor layer 122 through the first lighting layer 124, such that the first lighting layer 124 emits light. When the light emitting diode structure 100 is subjected to electrostatic discharge, the reverse current protection element 150 can prevent the LED element 120 from generating a reverse electric current flowing in another direction that is opposite to the electric current I. Moreover, the electric current $I_2$ is generated by the first and second conductors 172, 174 and flows from the second P-type semiconductor layer 168 to the second N-type semiconductor layer 164 through the second lighting layer 166. The directions of the electric currents $I_1$ and $I_2$ of the light emitting diode structure 100 are illustrated in FIG. 2B.

Figure 5:
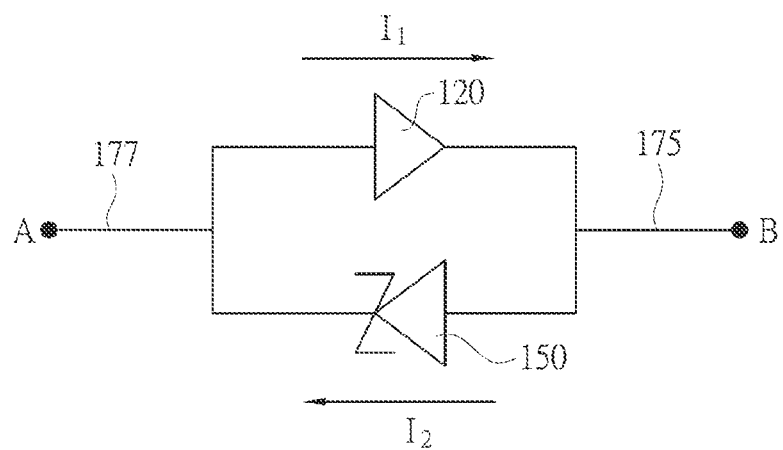
FIG. 5 is a schematic view of the equivalent circuit of the LED element and the reverse current protection element of FIG. 4.

FIG. 5 is a schematic view of the equivalent circuit of the LED element 120 and the reverse current protection element 150 of FIG. 4. Referring to FIGS. 3B and 5, since the third conductor 176 is electrically connected to the first conductor 172 and the second electrode 134, and the fourth conductor 178 is electrically connected to the second conductor 174 and the first electrode 132, the LED element 120 and the reverse current protection element 150 are reversely connected in parallel. The reverse current protection element 150 can be regarded as a Zener diode and a protection mechanism to deal with reverse breakdown voltage.

The reverse current protection element 150 includes the stack layer 162, the first conductor 172, and the second conductor 174, and the stack layer 162 is located on the substrate 110 by sequentially stacking the second N-type semiconductor layer 164, the second lighting layer 166, and the second P-type semiconductor layer 168. Thus, the reverse current protection element 150 and the LED element 120 can be manufactured at the same time, such as through physical vapor deposition (PVD), photolithography and etching processes. As a result, the light emitting diode structure 100 includes an equivalent circuit that models a Zener diode so that the light emitting diode structure 100 can be protected against electrostatic discharge (ESD) without the use of an additional physical Zener diode. Hence, manufacturing costs for the light emitting diode structure 100 are significantly reduced and the reverse current protection element 150 of the light emitting diode structure 100 does not take up a module space for receiving the light emitting diode structure 100.

Figure 6:
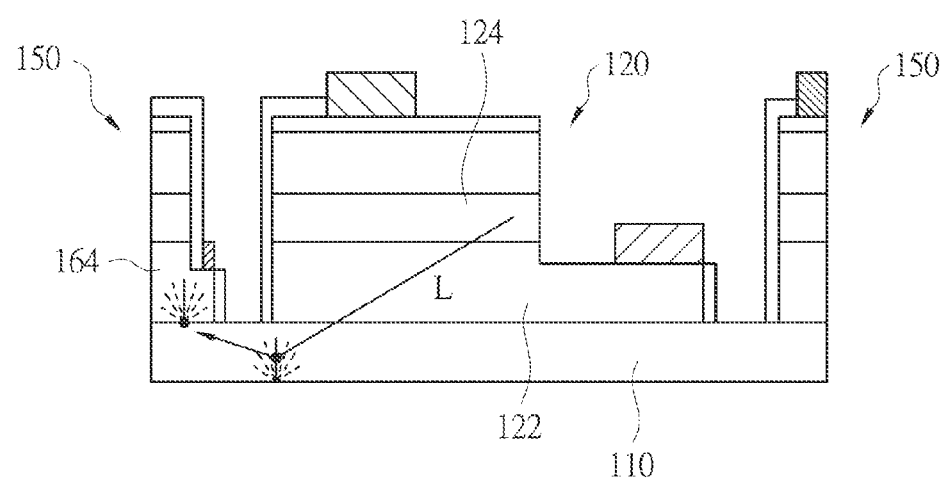
FIG. 6 is a schematic view of the direction of a light beam from a first lighting layer of FIG. 3A.

FIG. 6 is a schematic view of the direction of a light beam L from the first lighting layer 124 of FIG. 3A. Referring to FIGS. 3A and 6, the first and second insulation gaps D1 and D2 are defined between the reverse current protection element 150 and the LED element 120, as described above. When the first and second lighting layers 124, 126 emit light, the path of light extraction is increased by the first and second insulation gaps D1 and D2. Thus, the light emitting efficiency of the light emitting diode structure 100 can be improved, and the brightness of the light emitting diode structure 100 can be enhanced.

In some embodiments, the first insulation gap D1 destroys total reflection of light from the first lighting layer 124, such that the first lighting layer 124 can emit light perpendicular to the substrate 110, and the light beam L can be emitted from the area neighboring the LED element 120, as shown in FIG. 6.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode structure, comprising:
   a substrate;
   an LED element, comprising;
      a first N-type semiconductor layer located on the substrate;
      a first lighting layer located on part of the first N-type semiconductor layer, wherein a remaining part of the first N-type semiconductor layer is exposed from the first lighting layer;
      a first P-type semiconductor layer located on the first lighting layer;
      a first transparent conductive layer covering the first P-type semiconductor layer;
      a first electrode located on the first transparent conductive layer; and a second electrode located on an uncovered part of the first N-type semiconductor layer;

a reverse current protection element located on the substrate and surrounding the LED element, an insulation gap being defined between the LED element and the reverse current protection element, the reverse current protection element comprising:

a stack layer formed on the substrate by sequentially stacking a second N-type semiconductor layer, a second lighting layer, and a second P-type semiconductor layer, part of the second N-type semiconductor layer adjacent to the first electrode being exposed and not covered by the second lighting layer and the second P-type semiconductor layer;

a first conductor located on the second P-type semiconductor layer adjacent to the second electrode; and a second conductor located on an exposed part of the second N-type semiconductor layer;

a third conductor electrically connected to the first conductor and the second electrode; and a fourth conductor electrically connected to the second conductor and the first electrode, such that the LED element is reversely connected to the reverse current protection element in parallel.

2. The light emitting diode structure of claim 1, wherein the first electrode and the second electrode are located on opposite sides of the LED element.

3. The light emitting diode structure of claim 1, wherein the first conductor and the second conductor are located on opposite sides of the reverse current protection element.

4. The light emitting diode structure of claim 1, wherein the reverse current protection element further comprises a second transparent conductive layer that is formed on the second P-type semiconductor layer.

5. The light emitting diode structure of claim 1, further comprising:

a first insulation layer covering a sidewall of the LED element that faces the second conductor.

6. The light emitting diode structure of claim 5, further comprising:

a second insulation layer covering a sidewall of the reverse current protection element that faces the first electrode.

7. The light emitting diode structure of claim 6, wherein a first insulation gap is defined between the first insulation layer and the second insulation layer.

8. The light emitting diode structure of claim 1, further comprising:

a third insulation layer covering a sidewall of the LED element that faces of the first conductor.

9. The light emitting diode structure of claim 8, further comprising:

a fourth insulation layer covering a sidewall of the reverse current protection element that faces the second electrode.

10. The light emitting diode structure of claim 9, wherein a second insulation gap is defined between the third insulation layer and the fourth insulation layer.

11. The light emitting diode structure of claim 1, wherein a cross-sectional area of the LED element in a direction parallel to the substrate is larger than a projection area of the reverse current protection element on the substrate.

12. The light emitting diode structure of claim 1, wherein the first P-type semiconductor layer, the second P-type semiconductor layer, the first N-type semiconductor layer and the second N-type semiconductor layer are made of a material that comprises nitride.

13. The light emitting diode structure of claim 1, wherein the first P-type semiconductor layer, the second P-type semiconductor layer, the first N-type semiconductor layer and the second N-type semiconductor layer are made of a material that comprises gallium nitride.

14. The light emitting diode structure of claim 1, wherein the reverse current protection element is a Zener diode.

15. The light emitting diode structure of claim 1, wherein the substrate is a Sapphire substrate.

16. The light emitting diode structure of claim 6, wherein the first insulation layer and the second insulation layer are made of a material that is selected from the group consisting of silicon dioxide ($SiO_2$), silicon nitride (SiN), and combinations thereof.

17. The light emitting diode structure of claim 9, wherein the third insulation layer and the fourth insulation layer are made of a material that is selected from the group consisting of silicon dioxide ($SiO_2$), silicon nitride (SiN), and combinations thereof.

* * * * *